United States Patent
Ikeda et al.

(10) Patent No.: US 7,763,496 B2
(45) Date of Patent: Jul. 27, 2010

(54) STACKED SEMICONDUCTOR MEMORY DEVICE AND CONTROL METHOD THEREOF

(75) Inventors: Hiroaki Ikeda, Tokyo (JP); Kayoko Shibata, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 492 days.

(21) Appl. No.: 11/708,579

(22) Filed: Feb. 21, 2007

(65) Prior Publication Data

US 2007/0194455 A1    Aug. 23, 2007

(30) Foreign Application Priority Data

Feb. 22, 2006    (JP) .............................. 2006-045263

(51) Int. Cl.
*H01L 21/44*    (2006.01)
(52) U.S. Cl. ............................. 438/109; 438/6; 438/128
(58) Field of Classification Search ................... 438/5, 438/6, 10, 109, 128
See application file for complete search history.

(56) References Cited

U.S. PATENT DOCUMENTS 7,494,846 B2 * 2/2009 Hsu et al. .................... 438/109
7,548,444 B2 * 6/2009 Matsui et al. ................. 365/51
2005/0082664 A1 * 4/2005 Funaba et al. ............... 257/724

FOREIGN PATENT DOCUMENTS

| JP | 2004-327474 | 11/2004 |
|----|-------------|---------|
| JP | 2005-191172 | 7/2005  |
| JP | 2006-13337  | 1/2006  |

* cited by examiner

*Primary Examiner*—Kevin M Picardat
(74) *Attorney, Agent, or Firm*—Young & Thompson (57) ABSTRACT

A stacked semiconductor memory device includes an interface chip and a plurality of core chips, in which the interface chip and the plurality of core chips are stacked. The core chips are mutually connected by a plurality of data through electrodes. The core chips each include a plurality of memory arrays. In response to an access request, the plurality of memory arrays corresponding to a predetermined data through electrode are activated, and the plurality of activated memory arrays and the predetermined data through electrode are sequentially connected. Thereby, even though it requires approximately ten-odd ns for transferring the first data, similarly to the conventional case, it is possible to transfer the subsequent data at high speed determined by the reaction rate (1 to 2 ns) of the through electrode. As a result, it becomes possible to increase a bandwidth while suppressing the number of through electrodes.

11 Claims, 12 Drawing Sheets

STACKED SEMICONDUCTOR MEMORY DEVICE AND CONTROL METHOD THEREOF

TECHNICAL FIELD

The present invention relates to a stacked semiconductor memory device and a control method thereof. More particularly, the invention relates to a stacked semiconductor memory device in which data or the like are sent and received via a plurality of through electrodes arranged on semiconductor chips, and also to a control method thereof.

BACKGROUND OF THE INVENTION

In recent years, the storage capacity of semiconductor memory devices, represented by a DRAM (Dynamic Random Access Memory), has increased. It is increasingly demanded that these devices can operate at higher speeds. The increase in storage capacity has been achieved by making memory cells smaller and by increasing the chip size. However, the miniaturization of memory cells is physically limited, and the increase in chip size leads to a reduction of yield and impairs an increase of operating speed.

To solve these problems fundamentally, there has been proposed a method such that a core unit having memory cells and an interface unit having peripheral circuits to the memory cells are provided as chips that are independent of each other, and a plurality of core chips can be allocated to one interface chip (see Japanese Patent Application Laid-open No. 2004-327474, Japanese Patent Application Laid-open No. 2005-191172 and Japanese Patent Application Laid-open No. 2006-13337). This can greatly decrease the size of each chip. In view of this, the method is expected to increase the storage capacity of semiconductor memory devices even more, while preserving high yield of the semiconductor memory devices.

Assume that the core unit and the interface unit are separate chips. The core chip and the interface chip can be fabricated in a memory process and a logic process, respectively. Generally, transistors made in the logic process can operate at higher speed than the transistors made in the memory process. Hence, if the interface chip is manufactured in the logic process, it can operate faster than the conventional interface chips. As a result, the interface chip enables the semiconductor memory device incorporating it to operate at high speed. Furthermore, the operating voltage of the interface chip can be lowered by about 1V, which helps to reduce the power consumption in the semiconductor memory device.

As described in Japanese Patent Application Laid Open No. 2004-327474, Japanese Patent Application Laid-open No. 2005-191172 and Japanese Patent Application Laid-open No. 2006-13337, the stereoscopic stacking of the plurality of semiconductor chips permits suppression of an increase in a packaging area on the printed circuit board.

In such a stacked semiconductor memory device, the core chips and the interface chips are connected through electrodes. The through electrode is an electrode arranged such that it penetrates a semiconductor substrate that configures the core chip or the interface chip. The through electrode has very small parasitic capacitance and parasitic inductance compared to a bonding wire, a TAB tape and the like. Thus, the through electrode can transfer a signal between the chips at very high speed. Another advantage is that, unlike the bonding wire or the TAB tape, the through electrode does not cause an increase in area in the planar direction, so that it greatly contributes to reducing the entire size of the stacked semiconductor memory devices.

Generally, one core chip is formed with a plurality of memory arrays (such as a memory bank), and one data through electrode is allotted the plurality of memory arrays. In other words, the plurality of memory arrays share one through electrode. For this reason, a simultaneous data transfer from the plurality of memory arrays (or to the plurality of memory arrays) by using one through electrode is not possible. The data transfer is only possible to one memory array in one operation.

On the other hand, a time during which an instruction is issued to access the memory array, the level of an internal bus is determined, and data is then read out from the memory array, or the data is written in the memory array, is subject to restriction of the reaction rate (4 to 7 ns) of the internal bus arranged within the memory array. When the core chip is a DRAM core, ten-odd ns are required. Thus, when the reaction rate (1 to 2 ns) of the through electrode, an output retaining period (1 to 2 ns) of the data, and the like are added, the limit of a data transfer cycle during which one through electrode is used is approximately 15 to 20 ns, and thus, it has been difficult to obtain a sufficient bandwidth.

In order to increase the bandwidth in the stacked semiconductor memory device, a plurality of memory arrays that do not share the through electrode can be probably operated in parallel. Accordingly, when the number of memory arrays included in one core chip is increased by segmenting the memory array included in one core chip, it becomes possible to further multiplex the parallel operation, thereby greatly increasing the bandwidth as a whole.

However, when the number of the memory arrays included in one core chip is increased, the number of through electrodes increases in proportion thereto. Therefore, an area occupied by the through electrode increases. This results in an increase in chip area, or in a decrease of a memory capacity. Another problem is that a defect occurs at a predetermined probability in the manufacturing of the through electrode, so that when the number of through electrodes is large, it is more probable that a defective through electrode is included in one core chip, thereby decreasing the yield.

Thus, in the conventional stacked semiconductor memory device, it has been difficult to increase a bandwidth while suppressing the number of through electrodes.

SUMMARY OF THE INVENTION

The present invention has been achieved to solve the above problems, and an object of the invention is to provide a stacked semiconductor memory device capable of increasing a bandwidth while suppressing the number of through electrodes, and a control method of the stacked semiconductor memory device.

The present inventors have noted that there is a significant difference between the reaction rate of an internal bus, which is a planar wiring, and that of a through electrode, which is a stereoscopic wiring. That is, in conventional semiconductor memory devices configured by one chip, there is not so large a difference in reaction rates of various internal wirings. However, in stacked semiconductor memory devices in which a plurality of semiconductor chips are stacked, a high-speed bus, which is a through electrode, exists inside the device. The present invention is to solve the above-described problems by considering the difference in rate specific to such a stacked semiconductor memory device and sufficiently utilizing the performance of the through electrode.

A stacked semiconductor memory device according to the present invention, in which a plurality of semiconductor chips including a plurality of core chips are stacked, comprises a plurality of memory arrays each arranged on the plurality of core chips; a plurality of data through electrodes that mutually connect the plurality of core chips; an activation unit that activates, in response to an access request, the plurality of memory arrays corresponding to a predetermined data through electrode; and a connector that sequentially connects the plurality of memory arrays activated by the activation unit, and the predetermined data through electrode.

A method of controlling a stacked semiconductor memory device according to the present invention, in which a plurality of core chips each having a plurality of memory arrays are stacked and the plurality of core chips are mutually connected by a plurality of data through electrodes, comprises: a first step for activating, in response to an access request, the plurality of memory arrays corresponding to a predetermined data through electrode; and a second step for sequentially connecting the plurality of memory arrays activated by an activation unit, and the predetermined data through electrode.

According to the present invention, a plurality of memory arrays corresponding to a predetermined data through electrode are activated, and thereafter, a plurality of activated memory arrays and the data through electrode are sequentially connected. Thus, it becomes possible to greatly shorten a data transfer cycle via the data through electrode. That is, it requires approximately ten-odd ns to start transferring the first data, similarly to the conventional case. However, it is possible to transfer data subsequent to the first data at high speed determined by the reaction rate (1 to 2 ns) of the through electrode. Thus, according to the present invention, it is possible to increase a bandwidth while suppressing the number of through electrodes.

The plurality of memory arrays activated by the activation unit can be memory arrays included in the same core chip, or memory arrays included in different core chips. It is also possible that the plurality of memory arrays included in the same core chip and the plurality of memory arrays included in the different core chips can exist at the same time.

While data is successively transferred via the predetermined data through electrode, it is preferable that a parity of the data be transferred via a data through electrode different from the predetermined data through electrode. Accordingly, it is not necessary to additionally insert a cycle during which the parity is transferred, so that it is possible to transfer the parity without decreasing a bandwidth of actual data.

BRIEF DESCRIPTION OF THE DRAWINGS

The above and other objects, features and advantages of this invention will become more apparent by reference to the following detailed description of the invention taken in conjunction with the accompanying drawings, wherein.

DETAILED DESCRIPTION OF THE EMBODIMENTS

Preferred embodiments of the present invention will now be described in detail hereinafter with reference to the accompanying drawings.

Figure 1:
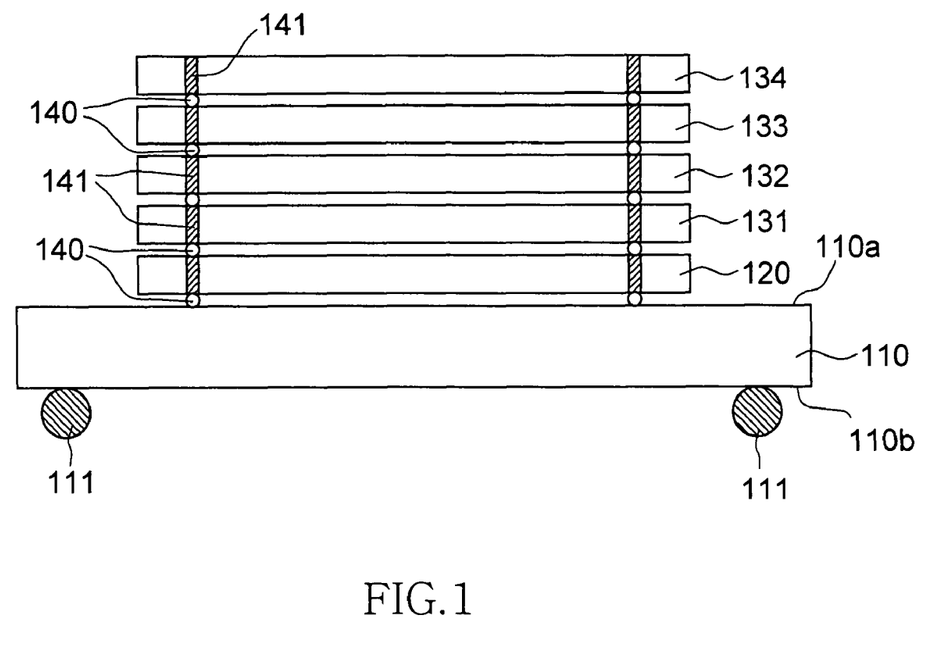
FIG. 1 is a schematic cross-sectional view showing a structure of a stacked semiconductor memory device according to a first embodiment of the present invention.

FIG. 1 is a schematic cross-sectional view showing a structure of a stacked semiconductor memory device according to a first embodiment of the present invention.

As shown in FIG. 1, the stacked semiconductor memory device according to the first embodiment includes an interposer substrate 110, an interface chip 120 mounted on one surface 110a of the interposer substrate 110, and a plurality (four, for example) of core chips 131 to 134 stacked on the interface chip 120. Thus, the stacked semiconductor memory device according to the first embodiment has a structure in which a plurality of semiconductor chips including the plurality of core chips 131 to 134 are stacked.

Transmission of a signal to and from an external circuit is performed via external terminals 111 arranged on the other surface 110b of the interposer substrate 110. Transmission of a signal between the interface chip 120 and the core chips 131 to 134 is performed via internal terminals 140 and through electrodes 141. In a stacked semiconductor memory device of this type, the signal width of a signal sent and received via the internal terminals 140 is larger than that of a signal sent and received via the external terminals 111. The signal widths are converted by the interface chip 120.

That is, a signal (such as an address, a command, and write data) supplied via the external terminals 111 from the external circuit is once supplied to the interface chip 120, the signal width of the supplied signal is extended by the interface chip 120, and thereafter, the resultant signal is supplied to the core chips 131 to 134. On the other hand, a signal (such as read data) supplied from the core chips 131 to 134 is once supplied to the interface chip 120, the signal width of the supplied signal is reduced by the interface chip 120, and thereafter, the resultant signal is outputted via the external terminals 111 of the interposer substrate 110. Accordingly, it becomes possible to greatly increase a bandwidth between memory cores such as a DRAM in which a significant parallel operation is possible but the operation speed is slow, and logical circuits such as CPU in which it is difficult to perform a significant parallel operation but the operation speed is fast.

Figure 2:
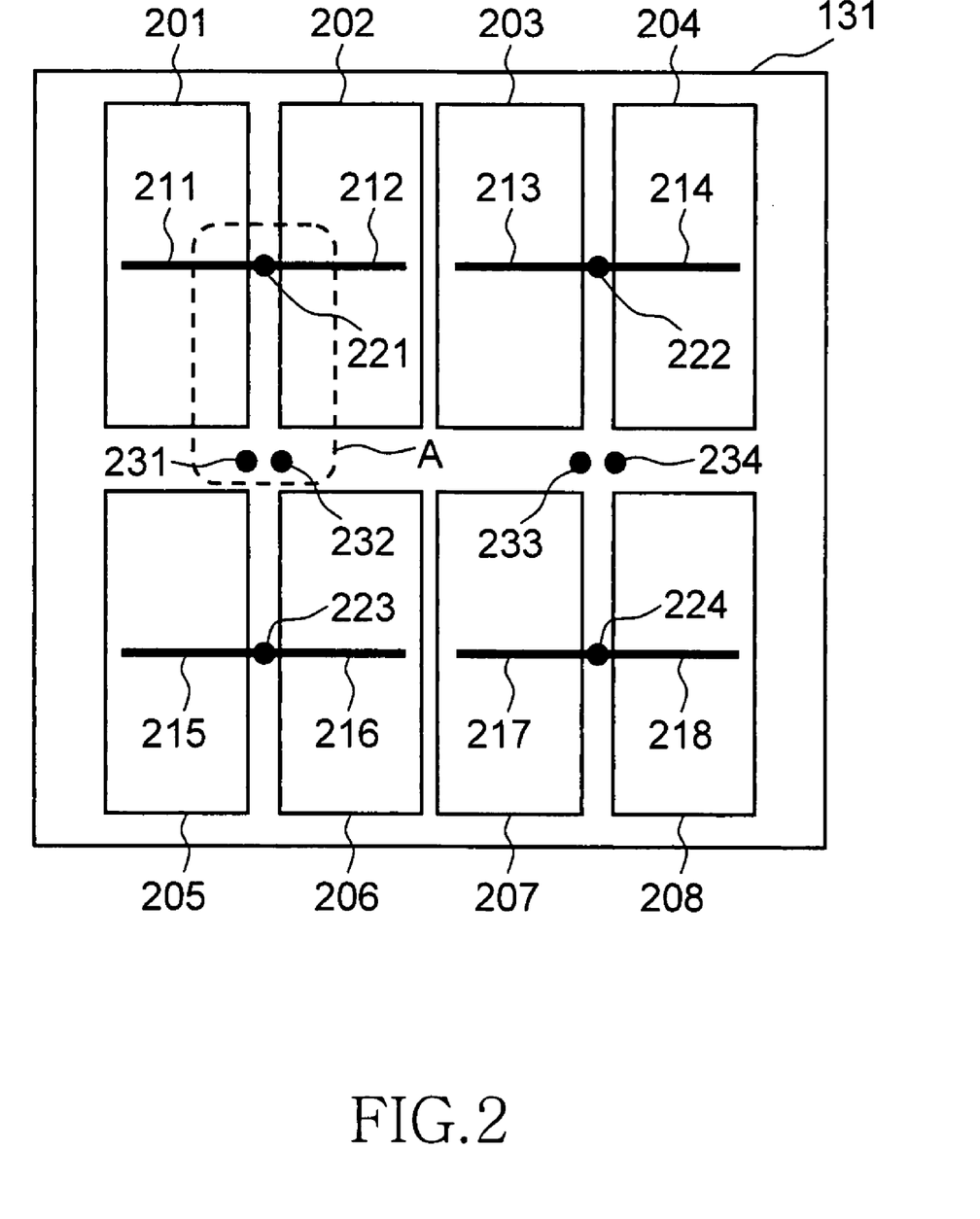
FIG. 2 is a schematic plan view showing the structure of the core chip 131.

FIG. 2 is a schematic plan view showing the structure of the core chip 131.

As shown in FIG. 2, the core chip 131 is formed with a plurality (eight, for example) of memory arrays 201 to 208. In the memory arrays 201 to 208, internal buses 211 to 218 are provided, respectively. Transmission (reading-out and writing) of data is performed via these internal buses 211 to 218. The memory arrays 201 to 208 are regions to be operable independently. A so-called memory bank corresponds to the memory arrays.

The two memory arrays that form a pair are allotted common data through electrodes 221 to 224, respectively. More specifically, the memory arrays 201 and 202 are allotted the data through electrode 221. The memory arrays 203 and 204 are allotted the data through electrode 222. The memory arrays 205 and 206 are allotted the data through electrode 223. The memory arrays 207 and 208 are allotted the data through electrode 224. The two memory arrays that form a pair are almost simultaneously activated in response to a corresponding activation signal S1 (explained later).

Each of the data through electrodes 221 to 224 is connected to the corresponding two internal buses. Thereby, each of the data through electrodes 221 to 224 is supplied with reading-out data from the corresponding two memory arrays and writing data to the corresponding two memory arrays.

As shown in FIG. 2, the core chip 131 also includes selection-signal through electrodes 231 to 234. The selection-signal through electrodes 231 to 234 are through electrodes to which a selection signal SL or SR explained later is supplied. Although the details are explained later, the selection signal SL is a signal for selecting one (left side) of the two memory arrays that form a pair, and the selection signal SR is a signal for selecting the other (right side) of the two memory arrays that form a pair. In the first embodiment, the selection signal SL is supplied via the selection-signal through electrodes 231 and 233, and the selection signal SR is supplied via the selection-signal through electrodes 232 and 234. Although not particularly limited, the selection signal SL supplied via the selection-signal through electrode 231 is a signal for selecting the memory arrays 201 and 205, and the selection signal SR supplied via the selection-signal through electrode 232 is a signal for selecting the memory arrays 202 and 206. The selection signal SL supplied via the selection-signal through electrode 233 is a signal for selecting the memory arrays 203 and 207, and the selection signal SR supplied via the selection-signal through electrode 234 is a signal for selecting the memory arrays 204 and 208.

The other core chips 132 to 134 basically have the same configuration as that of the core chip 131 shown in FIG. 2. Thereby, the data through electrodes 221 to 224 and the selection-signal through electrodes 231 to 234 are commonly connected to each of the core chips 131 to 134. Accordingly, the signal supplied from the interface chip 120 to these through electrodes is commonly supplied to all the core chips 131 to 134.

Figure 3:
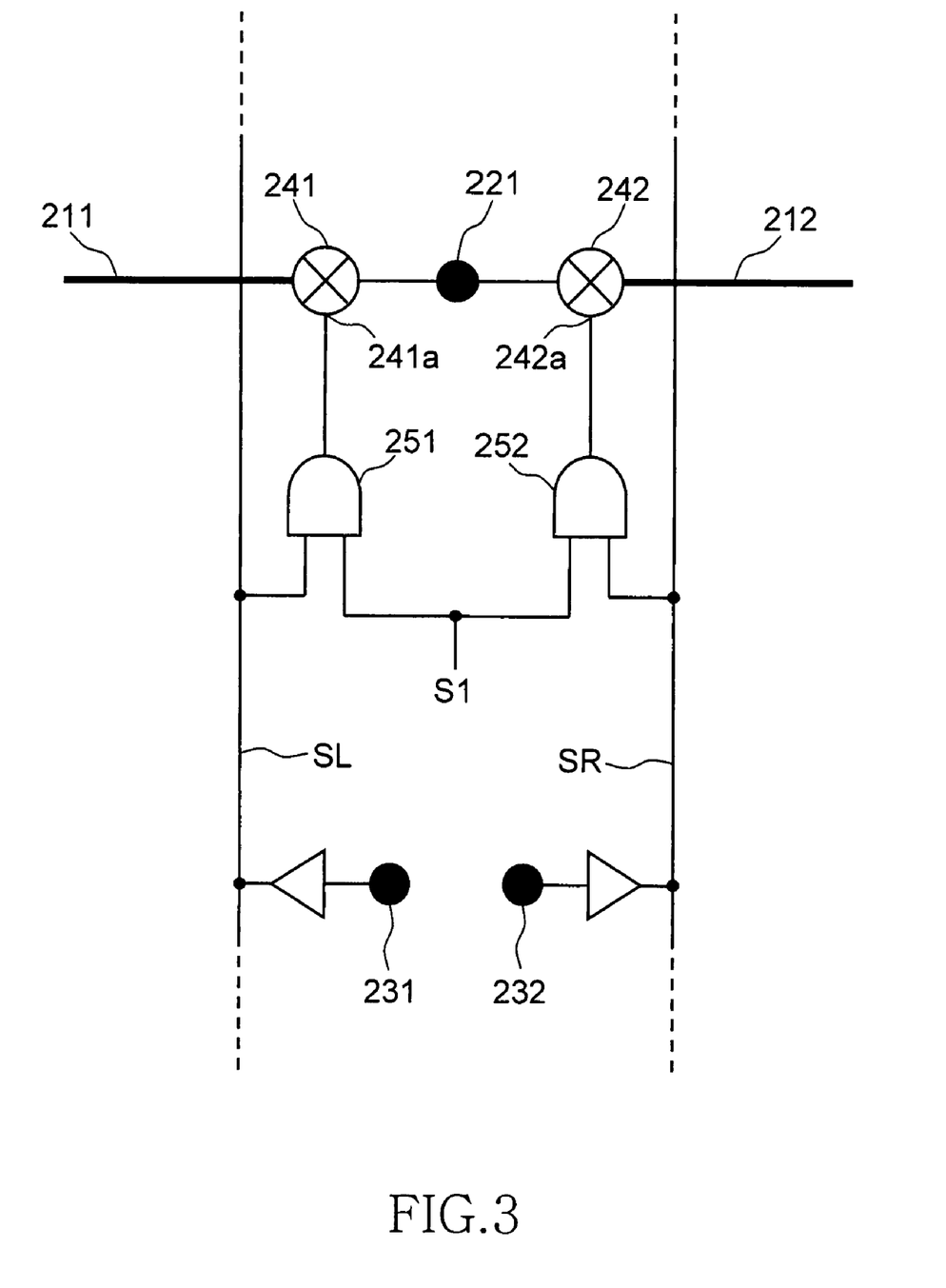
FIG. 3 is a detailed circuit diagram showing principal parts corresponding to an area A shown in FIG. 2.

FIG. 3 is a detailed circuit diagram showing principal parts corresponding to an area A shown in FIG. 2.

As shown in FIG. 3, the data through electrode 221 undergoes switch circuits 241 and 242, and is connected to the corresponding internal buses 211 and 212, respectively. As explained above, the internal buses 211 and 212 are buses each arranged in the memory arrays 201 and 202.

Control nodes 241a and 242a of the switch circuits 241 and 242 are supplied with output signals of AND circuits 251 and 252, respectively. One input node of the AND circuit 251 and one input node of the AND circuit 252 are commonly supplied with the activation signal S1. The activation signal S1 is a signal corresponding to the two memory arrays 201 and 202 that form a pair. When the activation signal S1 is active (high level), the memory arrays 201 and 202 are almost simultaneously activated. Such activation signal is allotted to each memory array pair. In the first embodiment, there exist a total of 16 pairs (=4 pairs×4 chips) of memory arrays. This means that there exist 16 kinds of activation signals.

The other input node of the AND circuits 251 and the other input node of the AND circuit 252 are supplied with the selection signals SL and SR supplied via the selection-signal through electrodes 231 and 232, respectively. The selection signals SL and SR are signals that exclusively become active (high level). Accordingly, the switch circuits 241 and 242 become exclusively conductive in conjunction therewith. As explained above, the selection signals SL and SR supplied via the selection-signal through electrodes 231 and 232 are also used for the other memory array pair (a pair formed of the memory arrays 203 and 204).

Although the regions A on the other core chips 132 to 134 basically have the same configuration as that shown in FIG. 3, the activation signals are individually allotted, as explained above. For example, the memory arrays 201 and 202 included in the core chips 132 to 134 are each activated by activation signals S2 to S4 (not shown), instead of the activation signal S1.

The stacked semiconductor memory device according to the first embodiment is thus configured. An operation of the stacked semiconductor memory device according to the first embodiment is explained next.

Figure 4:
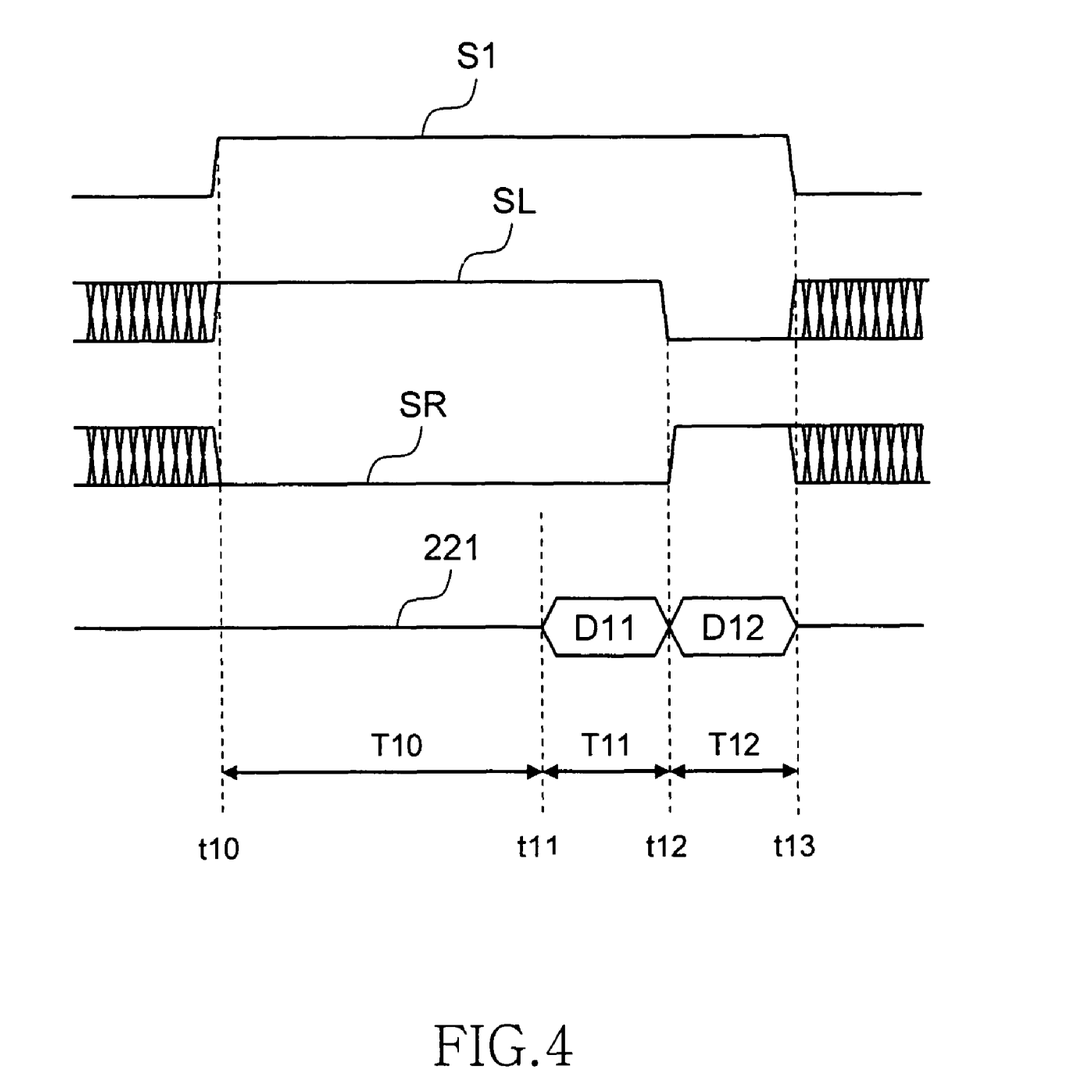
FIG. 4 is a timing chart for explaining an operation of the stacked semiconductor memory device according to the first embodiment.

FIG. 4 is a timing chart for explaining an operation of the stacked semiconductor memory device according to the first embodiment.

Firstly, before a time t10, the activation signal S1 is inactive (low level). Accordingly, the memory arrays 201 and 202 within the core chip 131 that correspond to the activation signal S1 is not yet activated. Further, before the time t10, the selection signals SL and SR are invalid (Don't Care).

Figure 5:
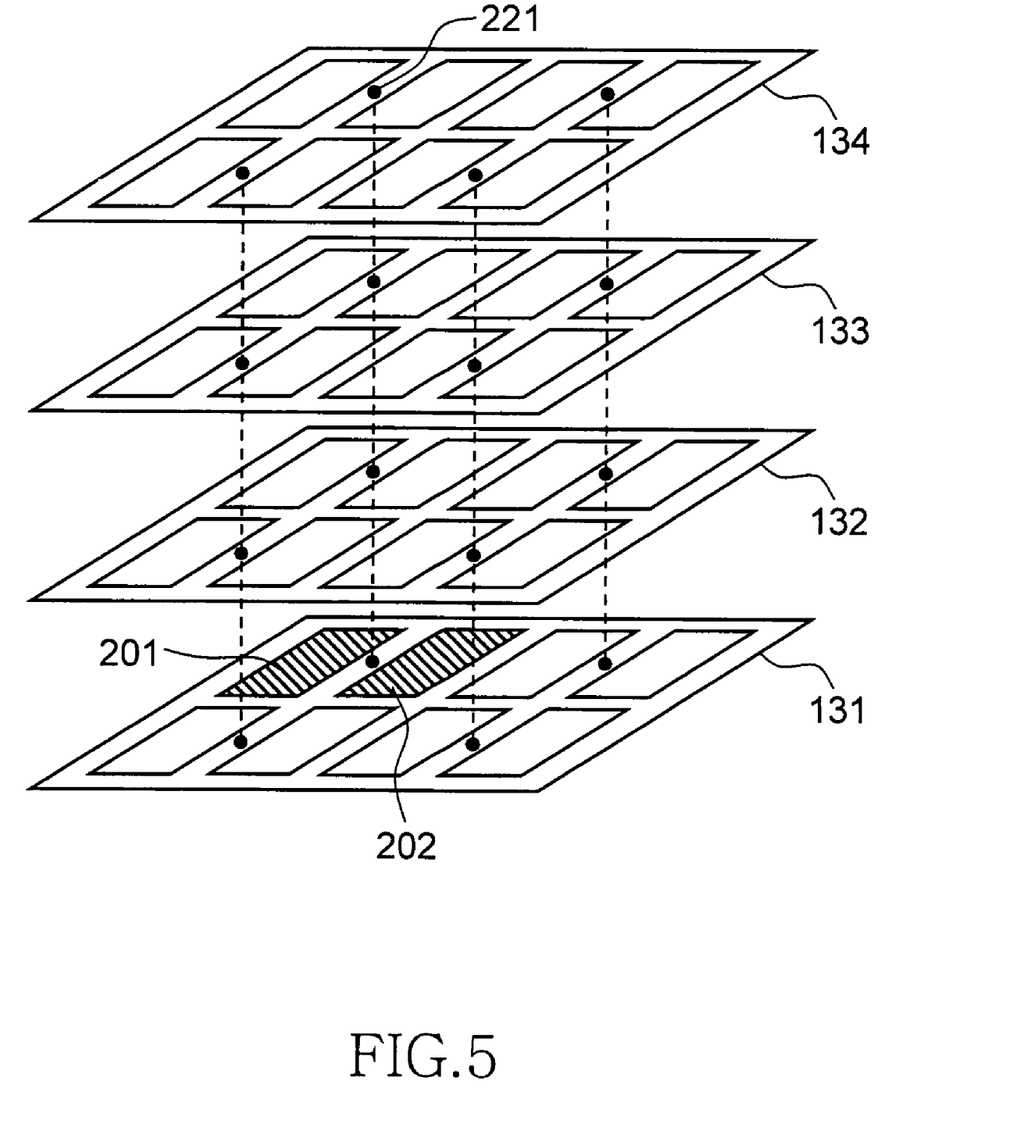
FIG. 5 is a schematic diagram showing an alignment of the memory arrays activated through a series of read-out operations shown in FIG. 4.

When there is an access request from outside, the activation signal S1 becomes active (high level) at the time t10. In response to this, the memory arrays 201 and 202 within the core chip 131 are almost simultaneously activated, and a data read-out operation is started. FIG. 5 is a schematic diagram showing an alignment of the memory arrays activated through a series of read-out operations, and shows that hatched memory arrays are activated memory arrays. As shown in FIG. 5, in the stacked semiconductor memory device according to the first embodiment, only a pair of memory arrays included in one core chip (core chip 131 in FIG. 5) is activated, and the memory arrays included in the other core chips (core chips 132 to 134 in FIG. 5) are not activated.

At the time t10, the selection signal SL is active (high level), and the selection signal. SR is inactive (low level). Thereby, the switch circuit 241 is turned on. Accordingly, the internal bus 211 included in the core chip 131, and the data through electrode 221 are connected. However, it requires a predetermined time from the data read-out operation is started until the data is outputted to the outside the memory arrays. As for a DRAM, a time of approximately 12 to 15 ns (period T10) is required. Therefore, during this period, the read-out data does not appear in the data through electrode 221.

Thereafter, when the period T10 elapses and a time t11 is reached, read-out data D11 is actually outputted from the memory array 201 within the core chip 131, and is transferred to the interface chip 120 via the data through electrode 221. At this time, although read-out data D12 has already outputted to the internal bus 212 also from the memory array 202 within the core chip 131, the switch circuit 242 is turned off, so that the read-out data D12 from the memory array 202 does not appear in the data through electrode 221. That is, the read-out data D11 from the memory array 201 and the read-out data D12 from the memory array 202 will not collide on the data through electrode 221.

Thereafter, when a period T11 elapses and a time t12 is reached, the selection signal SL is changed to inactive (low level), and the selection signal SR is changed to active (high level). Thereby, the switch circuit 241 is tuned off, and the switch circuit 242 is turned on. Accordingly, the internal bus 212 included in the core chip 131, and the data through electrode 221 are connected this time. At this time, the read-out data D12 has already been outputted to the internal bus 212 that corresponds to the memory array 202, so that the read-out data D12 from the memory array 202 is immediately outputted to the data through electrode 221.

Thereafter, when a period T12 elapses and a time t13 is reached, the activation signal S1 is changed to inactive (low level), and the selection signals SL and SR are invalid (Don't Care). This completes a series of read-out operations.

Unlike the period T10 that is required for outputting the first data D11, the periods T11 and T12 can be set to a very short time, for example a time of approximately 3 to 5 ns, determined by the reaction rate (1 to 2 ns) of the data through electrode 221. This enables a continuous transfer of a series of data D11 and D12 at higher speed, as compared to the conventional stacked semiconductor memory device.

As explained above, in the stacked semiconductor memory device according to the first embodiment, a pair of memory arrays included in one core chip is almost simultaneously activated, and the activated memory arrays are sequentially connected to the common data through electrode. Accordingly, although a time that is required for outputting the first data (D11 in the example shown in FIG. 4) is the same as that for the conventional case, it is possible to continuously output the subsequent data at high speed. Further, unlike the conventional stacked semiconductor memory device, it is not necessary to use a multiple of data through electrodes in parallel. Thus, it is possible to increase a bandwidth while suppressing the number of through electrodes.

In the first embodiment, the common data through electrode is allotted to the two memory arrays. However, when the configuration in which the common data through electrode is allotted to four memory arrays is employed, it becomes possible to continuously transfer 4-bit data at high speed in one operation.

Further, in the first embodiment, only the two memory arrays included in one core chip are activated. However, it is not necessary that a plurality of memory arrays to be activated belong to the same core chip, and the plurality of memory arrays can belong to different core chips. A second embodiment of the present invention is explained next, where a plurality of memory arrays that belong to different core chips are activated.

Figure 6:
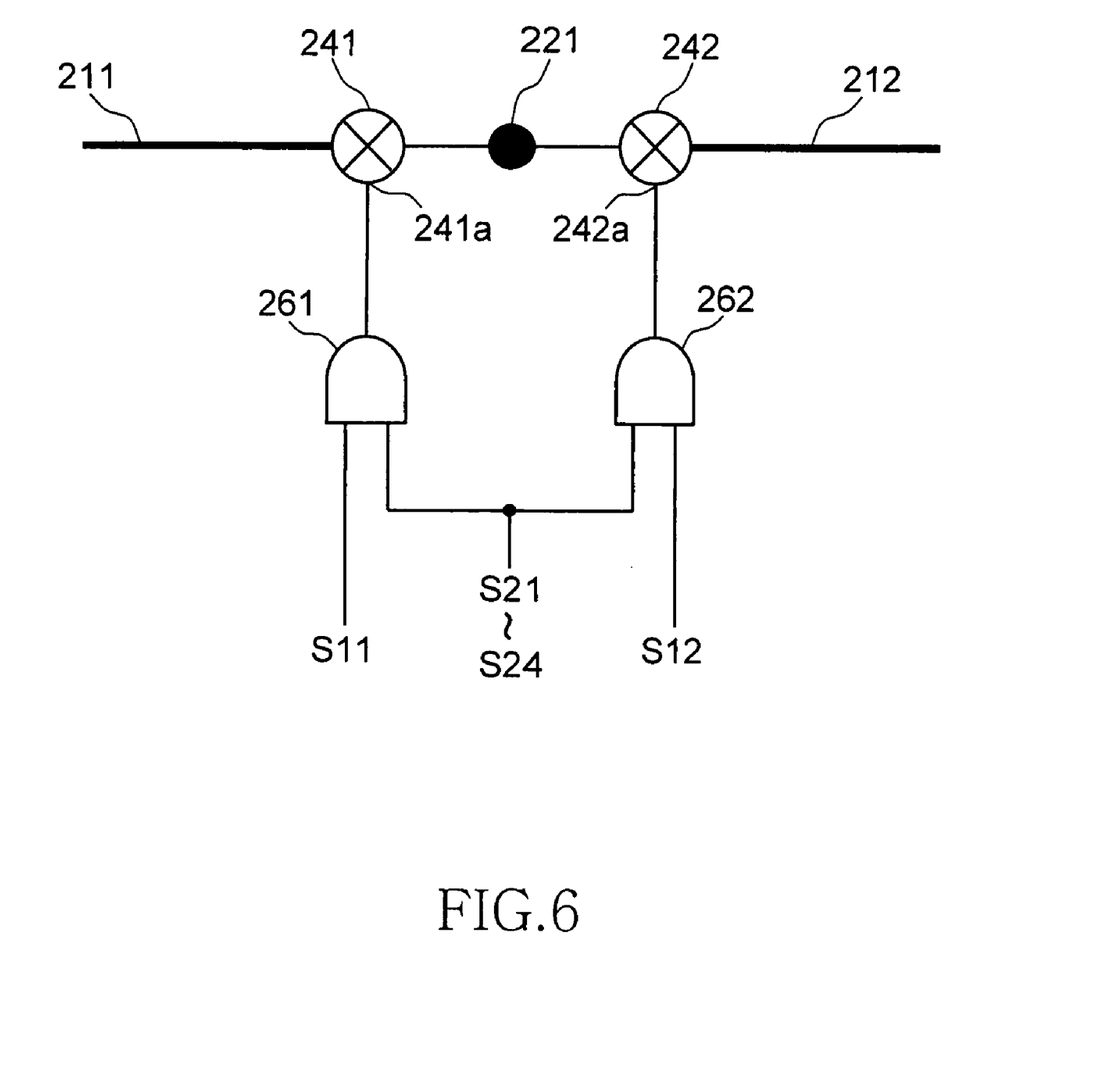
FIG. 6 is a circuit diagram showing a structure of principal parts of a stacked semiconductor memory device according to the second embodiment.

FIG. 6 is a circuit diagram showing a structure of principal parts of a stacked semiconductor memory device according to the second embodiment, and corresponds to an area A shown in FIG. 2. The basic configuration of the entire device is the same as those of FIGS. 1 and 2.

As shown in FIG. 6, in the second embodiment, the control nodes 241a and 242a of the switch circuits 241 and 242 are supplied with output signals of AND circuits 261 and 262, respectively. One input node of the AND circuit 261 is supplied with an activation signal S11, and one input node of the AND circuit 262 is supplied with an activation signal S12. The activation signal S11 is a signal that corresponds to the memory array 201 included in each of the core chips 131 to 134. When the activation signal S11 is active (high level), the memory array 201 included in each of the core chips 131 to 134 is almost simultaneously activated. On the other hand, the activation signal S12 is a signal that corresponds to the memory array 202 included in each of the core chips 131 to 134. When the activation signal S12 is active (high level), the memory array 202 included in each of the core chips 131 to 134 is almost simultaneously activated.

The other input node of the AND circuit 261 and the other input node of the AND circuit 262 are commonly supplied with selection signals S21 to S24. The selection signals S21 to S24 are signals that respectively correspond to the core chips 131 to 134, and these signals become exclusively active (high level).

Figure 7:
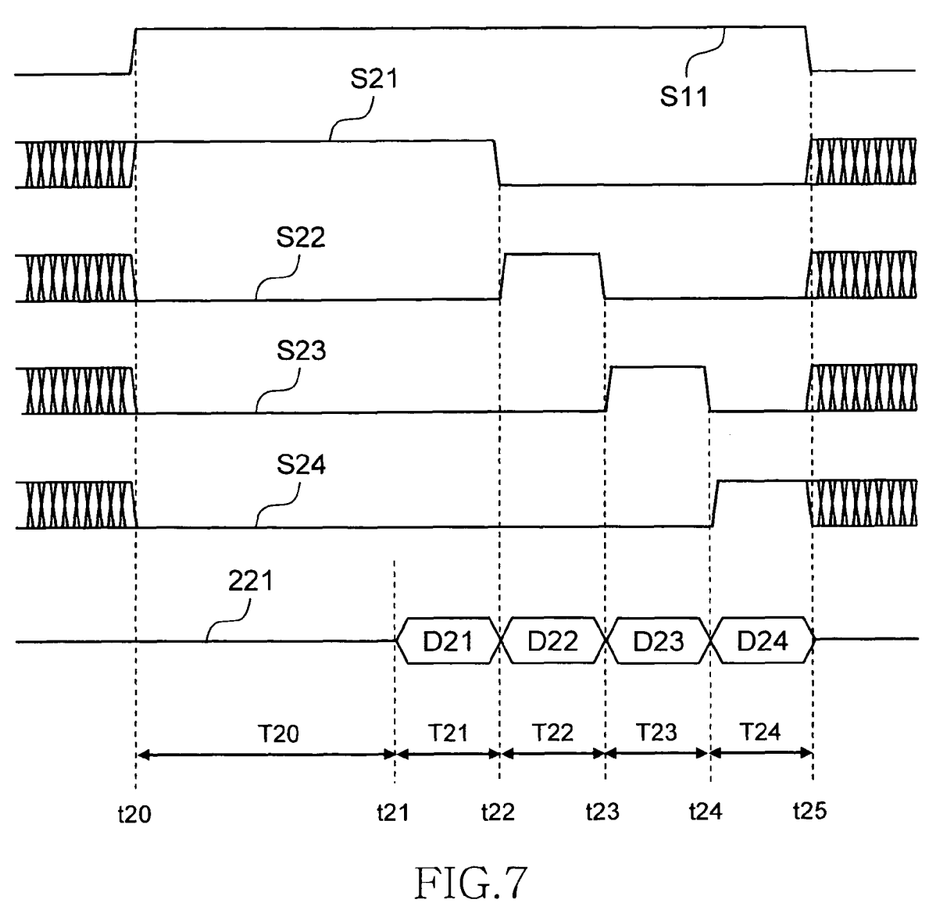
FIG. 7 is a timing chart for explaining an operation of the stacked semiconductor memory device according to the second embodiment.

FIG. 7 is a timing chart for explaining an operation of the stacked semiconductor memory device according to the second embodiment.

Firstly, before a time t20, the activation signal S11 is inactive (low level). Thus, the memory array 201 that corresponds to the activation signal S11 is not activated. Although not shown in FIG. 7, the activation signal S12 is also inactive (low level), and the memory array 202 that corresponds to the activation signal S12 is not activated either. Further, before the time t20, the selection signals S21 to S24 are invalid (Don't Care).

Figure 8:
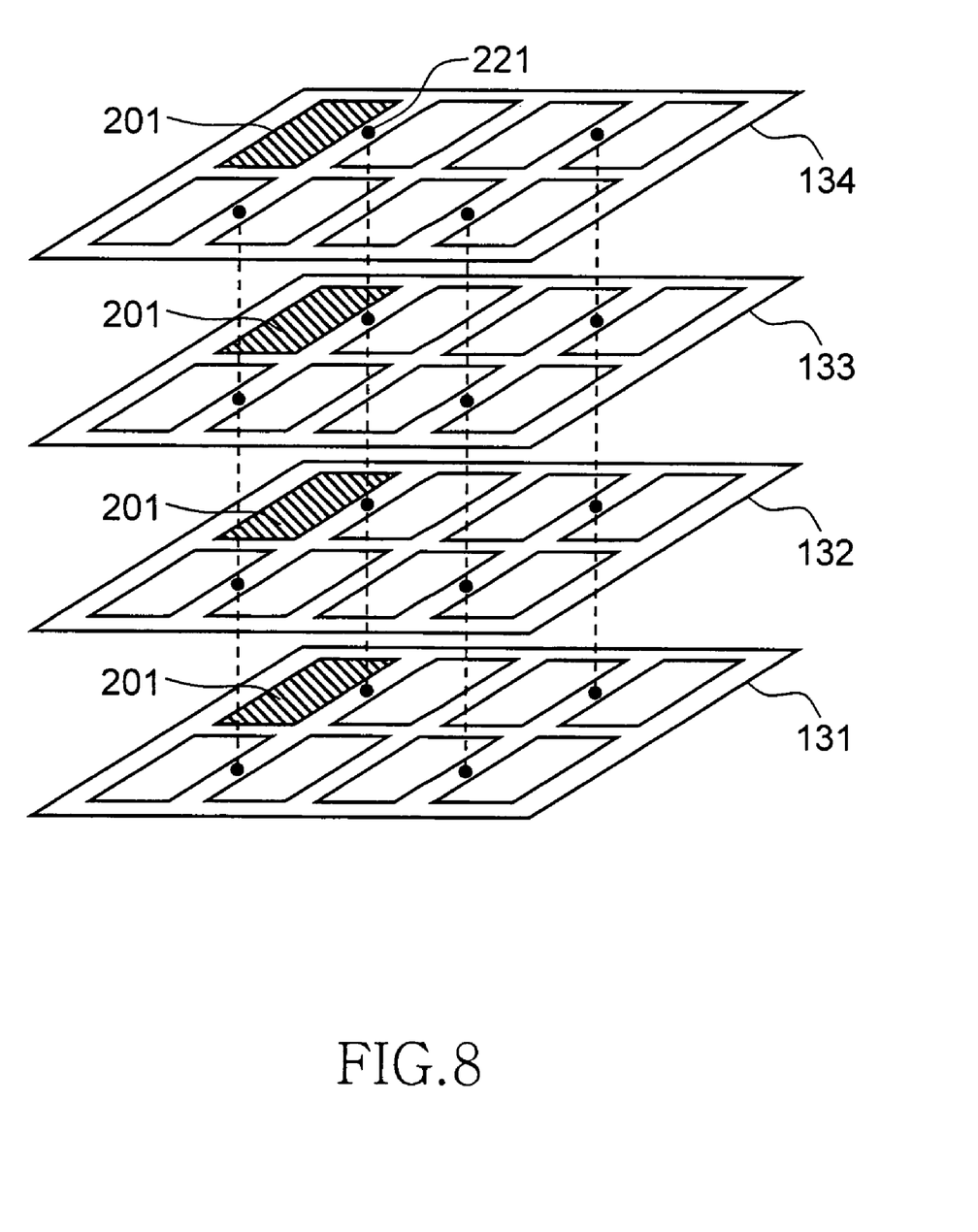
FIG. 8 is a schematic diagram showing an alignment of the memory arrays activated through a series of read-out operations shown in FIG. 7.

When there is an access request from outside, the activation signal S11 becomes active (high level) at the time t20. In response to this, each memory array 201 included in the core chips 131 to 134 is almost simultaneously activated, and a data read-out operation is started. FIG. 8 is a schematic diagram showing an alignment of the memory arrays activated through a series of read-out operations, and shows that hatched memory arrays are activated memory arrays. As shown in FIG. 8, in the stacked semiconductor memory device according to the second embodiment, all the memory arrays 201 included in the respective core chips are activated. Other memory arrays are not activated.

At the time t20, the selection signal S21 is active (high level), and the other selection signals S22 to S24 are inactive (low level). Thereby, the switch circuit 241 included in the core chip 131 is turned on, so that the internal bus 211 and the data through electrode 221 are connected. However, as explained above, it requires a predetermined time from the data read-out operation is started until the data is outputted to the outside the memory arrays. Thus, the read-out data does not immediately appear in the data through electrode 221.

Thereafter, when a period T20 elapses and a time t21 is reached, read-out data D21 is actually outputted from the memory array 201, and is transferred to the interface chip 120 via the data through electrode 221. At this time, although read-out data D22 to D24 are outputted to the respective internal buses 211 also from the memory arrays 201 included in the other core chips 132 to 134, the corresponding switch circuit 241 is turned off. Thus, the read-out data D22 to D24 does not appear in the data through electrode 221. That is, the read-out data D21 from the core chip 131 and the read-out data D22 to D24 from the core chips 132 to 134 will not collide on the data through electrode 221.

Thereafter, when a period T21 elapses and a time t22 is reached, the selection signal S22 is changed to active (high level), and when a period T22 elapses and a time t23 is reached, the selection signal S23 is changed to active (high level). When a period T23 elapses and a time t24 is reached, the selection signal S24 is changed to active (high level). Accordingly, the switch circuits 241 included in the core chips 132 to 134 are sequentially turned on, so that the internal buses 211 included in the core chips 132 to 134, and the data through electrode 221 are sequentially connected. At each timing, the read-out data D22 to D24 have already been outputted to the internal buses 211 within the core chips 132 to 134, so that the read-out data D22 to D24 are immediately outputted to the data through electrode 221.

Also in the second embodiment, unlike the period T20 that is required for outputting the first data D21, it is possible to set the periods T21 to T24 to a very short time determined by the reaction rate (1 to 2 ns) of the data through electrode 221, so that a series of data D21 to D24 can be transferred at high speed.

Thus, in the stacked semiconductor memory device according to the second embodiment, the memory arrays included in the different core chips are almost simultaneously activated, and the activated memory arrays are sequentially connected to the common data through electrode. Accordingly, similarly to the first embodiment, it is possible to continuously output the series of data at high speed.

In the embodiments described above, the memory array 201 included in each of the core chips 131 to 134 is almost simultaneously activated. However, the memory arrays 201 can be sequentially activated as long as the activation can be made in time for an outputting timing from each of the core chips 131 to 134.

In the first embodiment, only the plurality of memory arrays included in the same core chip are activated, and in the second embodiment, only the plurality of memory arrays included in the different core chips are activated. However, a plurality of memory arrays included in a plurality of core chips can be also activated. A third embodiment of the present invention is explained next, where a plurality of memory chips included in a plurality of core chips are activated.

Principal parts of a stacked semiconductor memory device according to the third embodiment have the same circuit configuration as that shown in FIG. 2.

Figure 9:
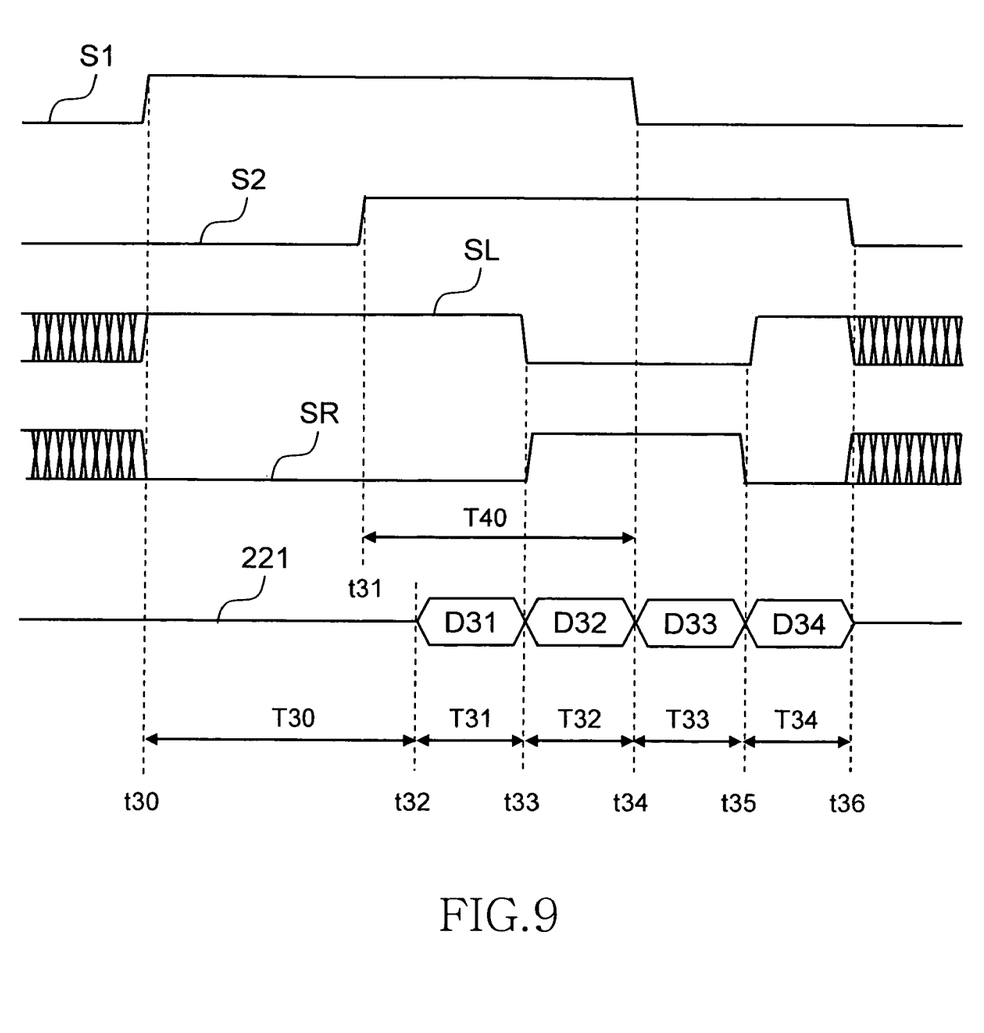
FIG. 9 is a timing chart for explaining an operation of the stacked semiconductor memory device according to the third embodiment.

FIG. 9 is a timing chart for explaining an operation of the stacked semiconductor memory device according to the third embodiment.

Firstly, before a time t30, the activation signal S1 is inactive (low level). Accordingly, the memory arrays 201 and 202 (memory arrays 201 and 202 included in the core chip 131) that correspond to the activation signal S1 are not activated. Before the time t30, the activation signal S2 is also inactive (low level). As explained above, the activation signal S2 is a signal for activating the memory arrays 201 and 202 included in the core chip 132. Accordingly, the memory arrays 201 and 202 included in the core chip 132 are not activated either. Before the time t30, the selection signals SL and SR are invalid (Don't Care).

When there is an access request from outside, the activation signal S1 becomes active (high level) at the time t30. In response to this, the memory arrays 201 and 202 included in the core chip 131 are almost simultaneously activated, and a data read-out operation is started. Thereafter, at a time t31, the activation signal S2 becomes active (high level). In response to this, also the memory arrays 201 and 202 included in the core chip 132 are almost simultaneously activated, and a data read-out operation is started.

Figure 10:
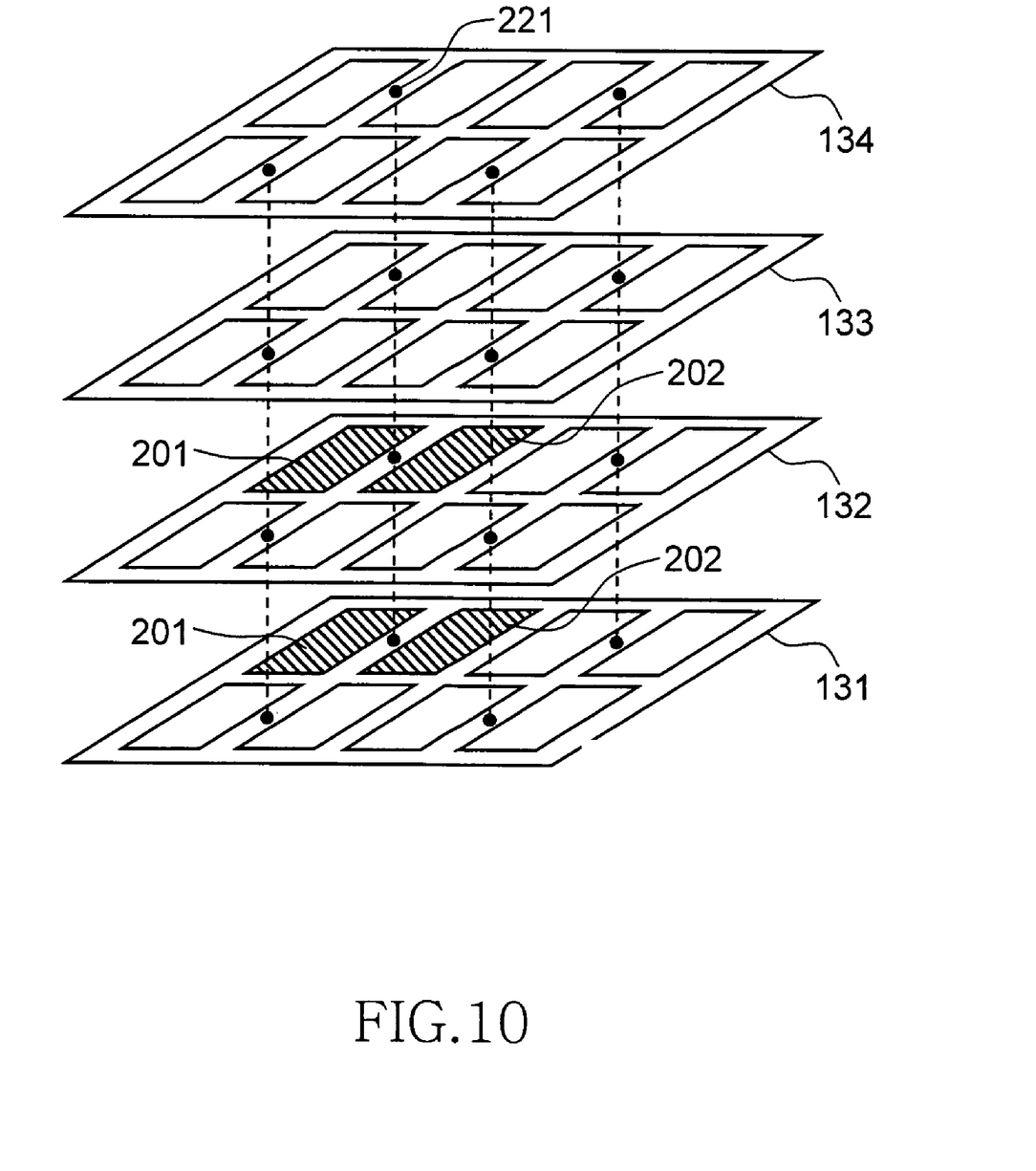
FIG. 10 is a schematic diagram showing an alignment of the memory arrays activated through a series of read-out operations shown in FIG. 9.

FIG. 10 is a schematic diagram showing an alignment of the memory arrays activated through a series of read-out operations, and shows that hatched memory arrays are activated memory arrays. As shown in FIG. 10, in the stacked semiconductor memory device according to the third embodiment, each pair of memory arrays included in the two core chips (core chips 131 and 132 in FIG. 10) is activated. The four activated memory arrays are memory arrays each corresponding to the data through electrode 221.

At the time t30, the selection signal SL is active (high level), and the selection signal SR is inactive (low level). Thereby, the switch circuits 241 included in the core chips 131 and 132 (also the switch circuits 241 included in the core chips 133 and 134) are turned on. Accordingly, the internal bus 211 included in the core chip 131, and the data through electrode 221 are connected. However, at a point before the time t31, the activation signal S2 is inactive (low level), so that the internal bus 211 included in the core chip 132, and the data through electrode 221 are not connected.

Thereafter, when a period T30 elapses from the time t30, and a time t32 is reached, read-out data D31 is actually outputted from the memory array 201 included in the core chip 131, and is transferred to the interface chip 120 via the data through electrode 221. Thereafter, when a period T31 elapses and a time t33 is reached, the selection signal SL is changed to inactive (low level), and the selection signal SR is changed to active (high level). Thereby, data D32 from the memory array 202 included in the core chip 131 is immediately outputted to the data through electrode 221.

On the other hand, when a period T40 elapses from the time t31, and a time t34 is reached, read-out data D33 is actually outputted from the memory array 201 included in the core chip 132. In conjunction therewith, the activation signal S1 is changed to inactive (low level).

Thereby, the read-out data D33 from the memory array 202 included in the core chip 132 is transferred to the interface chip 120 via the data through electrode 221. Thereafter, when a period T33 elapses and a time t35 is reached, the selection signal SL is changed to active (high level), and the selection signal SR is changed to inactive (low level). Thus, read-out data D34 from the memory array 201 included in the core chip 132 is outputted to the data through electrode 221. During this period, the activation signal S1 has already been changed to inactive (low level), so that the activation signal S1 and the read-out data from the core chip 131 will not collide.

Also in the third embodiment, since it is possible to set the periods T31 to T34 to a very short time determined by the reaction rate (1 to 2 ns) of the data through electrode 221, the series of data D31 to D34 can be transferred at high speed.

Thus, in the stacked semiconductor memory device according to the third embodiment, the plurality of memory arrays included in the plurality of core chips are continuously activated, and the activated memory arrays are sequentially connected to the common data through electrode. Accordingly, similarly to the embodiments described above, it is possible to continuously output the series of data at high speed.

Figure 11:
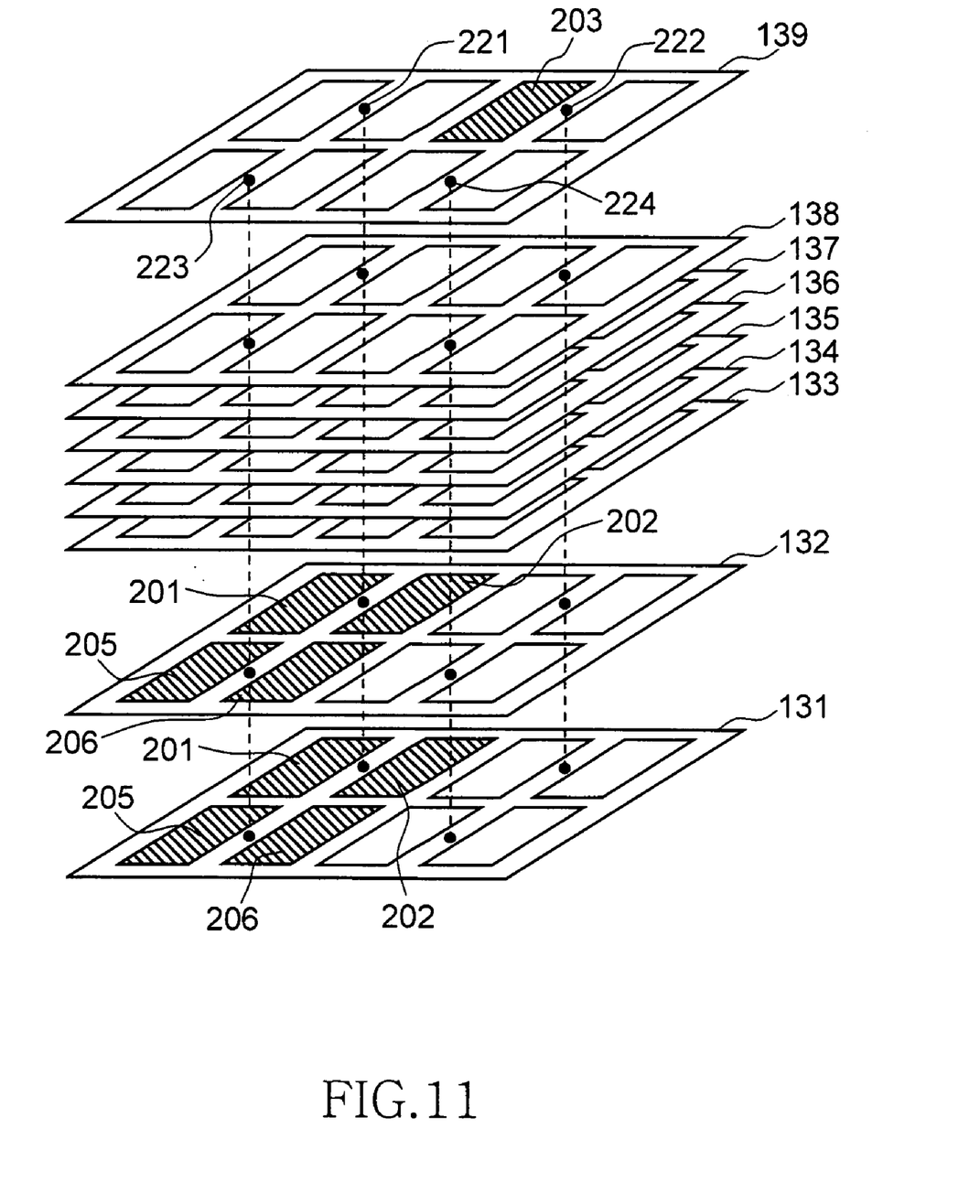
FIG. 11 is a schematic diagram for explaining a structure of a stacked semiconductor memory device according to a fourth embodiment of the present invention.

FIG. 11 is a schematic diagram for explaining a structure of a stacked semiconductor memory device according to a fourth embodiment of the present invention. Hatched memory arrays in FIG. 11 are memory arrays to be activated in the explanation below.

As shown in FIG. 11, unlike the first to third embodiments, the stacked semiconductor memory device according to the fourth embodiment includes nine core chips 131 to 139. Of the nine core chips, the eight core chips 131 to 138 are non-parity layers, and the other one core chip 139 is a parity layer. Although the interface chip and the like are not shown in FIG. 11, the interface chip, the interposer substrate, and the like are stacked as required.

An operation of the stacked semiconductor memory device according to the fourth embodiment is different from that of the third embodiment in that a total of 8-bit data are continuously transferred using two data through electrodes, and during the data transfer, a parity is transferred via a different data through electrode.

Figure 12:
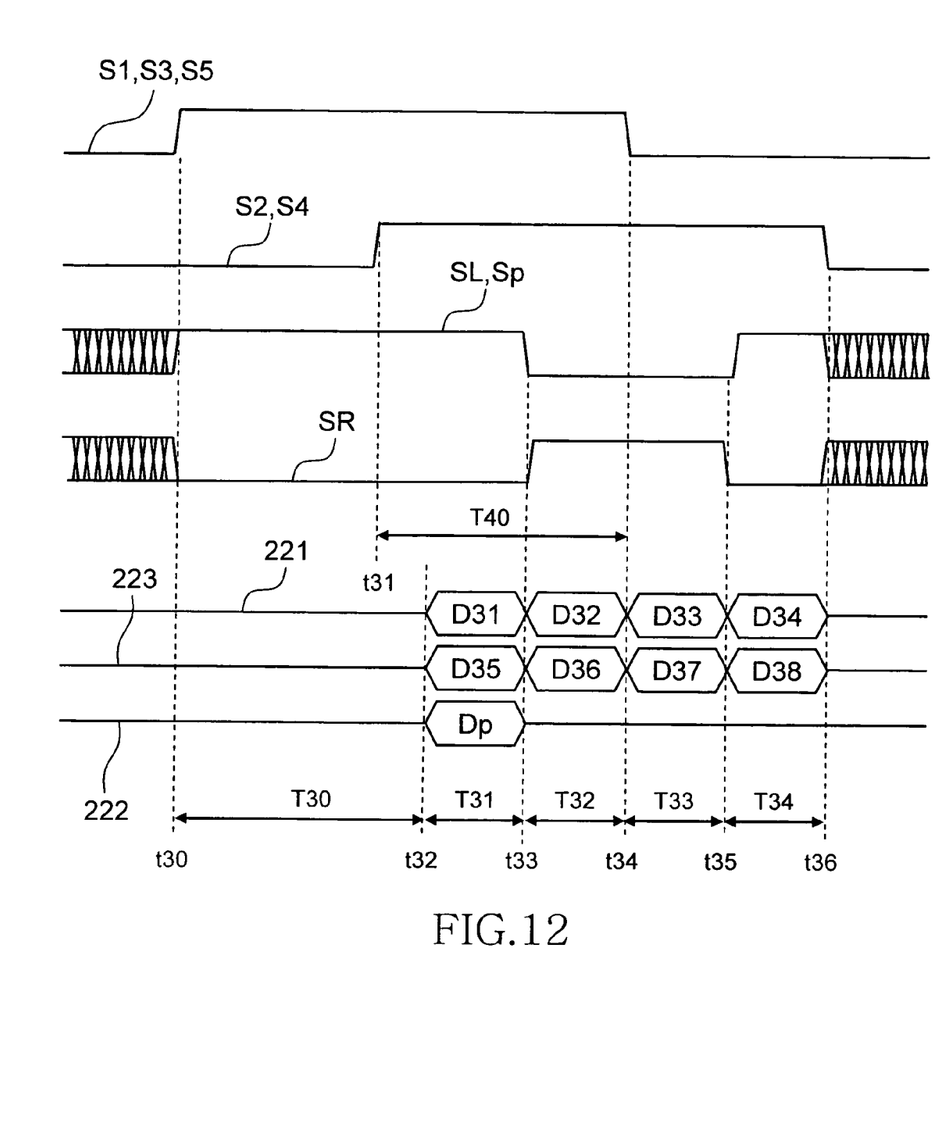
FIG. 12 is a timing chart for explaining the operation of the stacked semiconductor memory device according to the fourth embodiment.

FIG. 12 is a timing chart for explaining the operation of the stacked semiconductor memory device according to the fourth embodiment.

As shown in FIG. 12, the operation of the stacked semiconductor memory device according to the fourth embodiment is almost the same as that of the third embodiment. In the fourth embodiment, by using in parallel the two data through electrodes 221 and 223, 4-bit data are continuously transferred, respectively. As a result, a total of 8-bit data are transferred. In FIG. 12, a signal S3 is an activation signal for activating the memory arrays 205 and 206 included in the core chip 131, and a signal S4 is an activation signal for activating the memory arrays 205 and 206 included in the core chip 132.

As shown in FIG. 12, waveforms of the activation signals S1 and S2 and those of the selection signals SL and SR are identical with those shown in FIG. 9. The waveform of the activation signal S3 is the same as that of the activation signal S1, and the waveform of the activation signal S4 is the same as that of the activation signal S2. For this reason, a transfer operation of the read-out data D31 to D34 via the data through electrode 221 is the same as that of the third embodiment, and in parallel therewith, a transfer of read-out data D35 to D38 via the data through electrode 223 is to be performed.

On the other hand, in FIG. 12, a signal S5 is an activation signal for activating the memory array 203 included in the core chip 139, which is a parity layer, and a signal Sp is a selection signal for connecting the memory array 203 to the data through electrode 222. As shown in FIG. 12, the waveform of the activation signal S5 is the same as those of the activation signals S1 and S3, and the waveform of the selection signal Sp is the same as that of the selection signal SL. For this reason, from the core chip 139, which is a parity layer, parity data Dp is read out at the same timing as the read-out data D31 and D35 are outputted.

The data through electrode 222 to which the parity data Dp is transferred is a through electrode different from the data through electrodes 221 and 223 to which actual data D31 to D38 are transferred. For this reason, it is possible to transfer in parallel the parity data Dp that corresponds to the 8-bit actual data D31 to D38 while the 8-bit actual data D31 to D38 are being transferred. That is, it is not necessary to additionally insert a cycle during which the parity is transferred. Accordingly, it is possible to transfer the parity without decreasing the bandwidth of the actual data.

While a preferred embodiment of the present invention has been described hereinbefore, the present invention is not limited to the aforementioned embodiment and various modifications can be made without departing from the spirit of the present invention. It goes without saying that such modifications are included in the scope of the present invention.

For example, the number of core chips to be stacked in the present invention is not particularly limited. In each of the embodiments described above, the explanation has been made by noting the data read-out operation. However, a data writing operation can be similarly performed.

Types of memories formed on the core chip are not limited to DRAMs, and different types of memories can be used. However, since DRAMs have a characteristic in that, although they have a large storage capacity, it takes time to start reading-out the first data. In view of this, it can be said that as a subject to which the present invention is applied, DRAMs are most suitable.

The structure of the stacked semiconductor memory device shown in FIG. 1 is merely an example, and the stacked semiconductor memory device can have a structure other than this.

For example, the interface chip can be arranged in the top layer, and the interface chip can also serve as the interposer substrate.

Thus, according to the present invention, it is possible to increase the bandwidth of the stacked semiconductor memory device, as compared to the conventional case. Further, since it is possible to suppress the number of through electrodes, an area occupied by the through electrode can be decreased. Accordingly, it becomes possible to prevent an increase in chip area or a decrease of the memory capacity, and it is also possible to prevent a decrease in yield, which is caused by an increase of the number of through electrodes.

What is claimed is:

1. A method of controlling a stacked semiconductor memory device in which a plurality of core chips each having a plurality of memory arrays are stacked and the plurality of core chips are mutually connected by a plurality of data through electrodes, comprising:
    a first step for activating, in response to an access request, the plurality of memory arrays corresponding to a predetermined data through electrode; and
    a second step for sequentially connecting the activated memory arrays and the predetermined data through electrode.

2. The method of controlling a stacked semiconductor memory device as claimed in claim 1, wherein at the first step, a plurality of memory arrays included in the same core chip are activated.

3. The method of controlling a stacked semiconductor memory device as claimed in claim 1, wherein at the first step, a plurality of memory arrays included in different core chips are activated.

4. The method of controlling a stacked semiconductor memory device as claimed in claim 2, wherein at the first step, a plurality of memory arrays included in different core chips are activated.

5. The method of controlling a stacked semiconductor memory device as claimed in claim 1, wherein while data is successively transferred at the second step, a parity of the data is transferred via another data through electrode different from the predetermined data through electrode.

6. A method of controlling a semiconductor memory device in which a plurality of core chips each having a plurality of memory arrays are stacked and the plurality of core chips are mutually connected by a plurality of data through electrodes including first and second data through electrodes, comprising:
    a first step for successively transferring a series of data via the first data through electrode; and
    a second step for transferring, while the data is successively transferred at the first step, a parity of the data via the second data through electrode.

7. A method for a memory device including a plurality of memory chips each including a plurality of memory arrays and a through electrode, the memory chips being stacked with each other such that the through electrode of a lower one of the memory chips is connected to the through electrode of an upper one of the memory chips, the through electrodes of the memory chips being thereby electrically connected to each other to form a common electrode, the method comprising:
    activating selected ones of the memory arrays of the memory chips; and
    forming an electrical path between the common electrode and each of the selected ones of the memory arrays in sequence to perform a sequential data transfer between the common electrode and the selected ones of the memory arrays.

8. The method as claimed in claim 7, wherein the selected ones of the memory arrays include at least one of the memory arrays of each of the memory chips.

9. The method as claimed in claim 7, wherein the selected ones of the memory arrays include at least two of the memory arrays of at least one of the memory chips.

10. The method as claimed in claim 7, wherein each of the memory chips further includes a plurality of switches each coupled between the through electrode and an associated one of the memory arrays, and the forming the electrical path is performed by turning the switches between the through electrode and the selected one of the memory arrays on in sequence.

11. The method as claimed in claim 10, wherein each of the switches is controlled to be turned ON and OFF in response to an associate one of the activation signals and an associated one of the selection signals supplied thereto.

* * * * *